(12) United States Patent
Leobandung

(10) Patent No.: US 9,196,591 B2
(45) Date of Patent: Nov. 24, 2015

(54) CHIP WITH SHELF LIFE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 14/181,817

(22) Filed: Feb. 17, 2014

(65) Prior Publication Data

US 2015/0235970 A1    Aug. 20, 2015

(51) Int. Cl.
| | |
|---|---|
| *H01L 23/00* | (2006.01) |
| *H01L 21/02* | (2006.01) |
| *H01L 21/48* | (2006.01) |
| *H01L 23/373* | (2006.01) |

(52) U.S. Cl.
CPC ........ *H01L 23/564* (2013.01); *H01L 21/02164* (2013.01); *H01L 21/02238* (2013.01); *H01L 21/4871* (2013.01); *H01L 23/3736* (2013.01)

(58) Field of Classification Search
CPC ...... H01L 29/7869; H01L 29/78606; H01L 21/02554; H01L 27/1248; H01L 51/56; H01L 24/11; C23C 14/5853
See application file for complete search history.

(56) References Cited

U.S. PATENT DOCUMENTS

| | | | | |
|---|---|---|---|---|
| 4,900,695 A | * | 2/1990 | Takahashi et al. | ............ 438/625 |
| 6,016,000 A | * | 1/2000 | Moslehi | ........................ 257/522 |
| 6,124,198 A | * | 9/2000 | Moslehi | ........................ 438/622 |
| 6,458,547 B1 | * | 10/2002 | Bryan et al. | ...................... 506/9 |
| 7,111,213 B1 | * | 9/2006 | Dastidar et al. | ............... 714/724 |
| 7,304,324 B2 | | 12/2007 | Kuroda et al. | |
| 7,480,882 B1 | | 1/2009 | Song et al. | |
| 7,635,899 B2 | * | 12/2009 | Yang et al. | ..................... 257/371 |
| 7,743,963 B1 | * | 6/2010 | Chung | ........................ 228/179.1 |
| 7,851,816 B2 | * | 12/2010 | Dutta | .............................. 257/98 |
| 8,195,872 B2 | | 6/2012 | Ito | |
| 8,536,692 B2 | * | 9/2013 | Kuan et al. | .................... 257/686 |

(Continued)

FOREIGN PATENT DOCUMENTS

| | | |
|---|---|---|
| DE | 19512266 A1 | 3/1996 |
| DE | 19512266 C2 | 11/1998 |

OTHER PUBLICATIONS

Stolt et al. "Formation of Cu3Si and its catalytic effect on silicon oxidation at room temperature", Journal of Vacuum Science and Technology A 9, (3), May/Jun. 1991, pp. 1501-1505.

(Continued)

*Primary Examiner* — Benjamin Sandvik
*Assistant Examiner* — Gustavo Ramallo
(74) *Attorney, Agent, or Firm* — L. Jeffrey Kelly; Louis J. Percello

(57) ABSTRACT

A method of forming a semiconductor structure includes forming a recess within a silicon substrate of an IC chip near a circuit of the IC chip. A metal layer is formed in the recess and the IC chip is exposed to an oxygen-containing environment to initiate the oxidation of a portion of the silicon substrate below the metal layer and adjacent to the circuit. The oxidation process consumes the portion of the silicon substrate below the metal layer forming a silicon dioxide layer that damages the circuit and causes the IC chip to be inoperable. The time to oxidize the portion of the silicon substrate below the metal layer and damage the circuit represents the shelf life of the IC chip.

12 Claims, 7 Drawing Sheets

(56) References Cited

U.S. PATENT DOCUMENTS

| | | | |
|---|---|---|---|
| 2006/0099785 A1* | 5/2006 | Fuller et al. | 438/597 |
| 2006/0278981 A1* | 12/2006 | Trezza et al. | 257/734 |
| 2006/0281363 A1* | 12/2006 | Trezza | 439/502 |
| 2007/0026574 A1* | 2/2007 | Beatson et al. | 438/123 |
| 2007/0085078 A1* | 4/2007 | Kuroda et al. | 257/40 |
| 2007/0087130 A1* | 4/2007 | Arai | 427/457 |
| 2007/0226518 A1 | 9/2007 | Yasaki et al. | |
| 2008/0028477 A1 | 1/2008 | Lehmann et al. | |
| 2010/0323217 A1* | 12/2010 | Tachibana et al. | 428/626 |
| 2011/0304024 A1* | 12/2011 | Renna | 257/620 |
| 2012/0146193 A1* | 6/2012 | Stuber et al. | 257/618 |
| 2013/0072615 A1* | 3/2013 | Muro et al. | 524/406 |
| 2013/0227538 A1 | 8/2013 | Maruyama | |
| 2013/0253868 A1 | 9/2013 | Bansal et al. | |
| 2013/0254731 A1* | 9/2013 | Bansal et al. | 716/113 |

OTHER PUBLICATIONS

Hinode et al., "Abnormal room-temperature oxidation of silicon in the presence of copper", Journal of Vacuum Science and Technology A 20 (5), Sep./Oct. 2002, pp. 1653-1658.

* cited by examiner

CHIP WITH SHELF LIFE

BACKGROUND

The present invention generally relates to integrated circuits (IC), and more particularly to fabricating IC chips having a shelf life.

New IC technologies may include individual IC chips (i.e., "dies") arranged into a three dimensional integrated circuit, also known as a three dimensional semiconductor package (3D package). One type of 3D package may include two or more layers of active electronic components stacked vertically and electrically joined with some combination of through substrate vias and solder bumps. Most IC chips may not have a specific shelf life. IC chips may have a long lifespan and may even last forever if not powered up.

To continue the miniaturization trend in current IC technology, copper (Cu) metallization may be extensively used due to its low resistivity and high migration resistance. However, owing to the rapid diffusion of copper into silicon (Si) and silicon dioxide ($SiO_2$) copper structures may be covered with barrier metals and barrier insulators to prevent degradation of the IC. Copper may react with silicon at low temperatures and even at room temperature to form silicon dioxide. In the presence of oxygen, copper may act as a catalyst during the oxidation of silicon.

SUMMARY

The ability to manufacture integrated circuit (IC) chips having a shelf life may prevent, among other things, fraudulent use of sensitive data stored in the IC chips and/or stop unauthorized use of the IC chips after a certain period of time.

According to an embodiment of the present disclosure, a method of forming a semiconductor structure may include forming a recess within a silicon substrate of an IC chip adjacent to a circuit of the IC chip. A metal layer may be formed in the recess and the IC chip may be exposed to an oxygen-containing environment to initiate the oxidation of a portion of the silicon substrate below the metal layer and adjacent to the circuit.

According to another embodiment of the present disclosure, a semiconductor structure may include an IC chip comprising a silicon substrate and a circuit within the silicon substrate, a recess within the silicon substrate with a bottom portion of the recess in close proximity to the circuit and a metal layer on the bottom portion of the recess.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
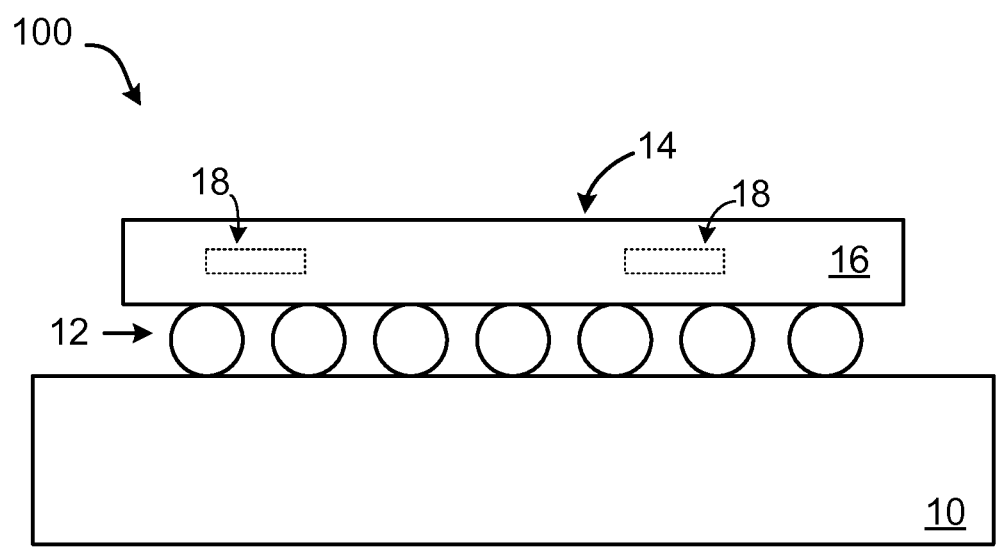
FIG. 1 is a cross-sectional view of a semiconductor structure depicting an integrated circuit (IC) chip after a chip bonding process, according to an embodiment of the present disclosure.

Exemplary embodiments now will be described more fully herein with reference to the accompanying drawings, in which exemplary embodiments are shown. This invention may, however, be modified in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

An integrated circuit (IC) chip may include a plurality of interconnected electronic circuits formed on a semiconductor substrate. IC chips may have a long lifespan, in some cases they may never expire. The extended life of current electronic devices, including IC chips, may put at risk sensitive data stored in the device after theft or unauthorized access. Limiting the life of an IC chip may find applications in areas such as weapon systems, chip security, and/or cyber security where sensitive information may need to be destroyed after a certain period of time in order to avoid security threats. If unauthorized access or theft occurs, confidential data stored in the IC chip may be read and misused. Accordingly, improving the formation of IC chips having a shelf life, or expiration date, may among other things, enhance data security in many industry or government sectors.

A method of forming an IC chip having shelf life, to prevent unauthorized use of data stored in the IC chip is described in detail below by referring to the accompanying drawings in FIGS. 1-7, in accordance with an illustrative embodiment of the present disclosure. IC chips having shelf life may be fabricated by taking advantage of certain properties of the chemical reaction between copper and silicon in the presence of oxygen in order to limit the life of the device. Copper (Cu) may have a catalytic effect on the oxidation of silicon and may lead to the formation of a silicon dioxide ($SiO_2$) compound under certain conditions, such as ambient (room) conditions of pressure and temperature. Owing to these properties, the chemical reaction between silicon, oxygen, and copper may be used to consume a silicon substrate in IC chips within a determined period of time to intentionally damage the IC chips thereby imposing a shelf life to the device.

According to an exemplary embodiment, IC chips having a shelf life may be fabricated by forming a localized layer of copper within the silicon substrate of the IC chip in close proximity to a predetermined critical circuit. The IC chip may be exposed to air or any other oxygen-containing environment to start the oxidation process and convert portions of the silicon substrate to silicon dioxide. The silicon substrate may be consumed during the oxidation reaction between the silicon present in the silicon substrate and the copper (Cu) diffusing from the copper layer, thereby destroying the critical circuit and in consequence disabling the IC chip. One embodiment by which to fabricate IC chips with shelf life is described in detail below by referring to the accompanying drawings in FIGS. 1-7.

Referring now to FIG. 1, a cross-sectional view of a semiconductor structure 100 after chip bonding is shown. The semiconductor structure 100 may include an IC chip 14 fabricated from a silicon substrate 16. The silicon substrate 16 may have a thickness ranging between approximately 100 μm to approximately 700 μm. The silicon substrate 16 may be made primarily of silicon, however the silicon substrate may also include other substances such as germanium or carbon alloyed with silicon. Other silicon-containing materials are also explicitly contemplated. The IC chip 14 may include numerous electronic circuits (not shown), including critical circuits 18, formed in the silicon substrate 16. These electronic circuits may be fabricated in or on the silicon substrate 16 by any fabrication methods typically known in the art. Exemplary electronic circuits may include transistors, capacitors, inductors, diodes or any combination thereof. Some of those electronic circuits may be critical for the correct functioning of the IC chip 14, such as, for example, the critical circuits 18. By selectively damaging one or more critical circuits 18, the IC chip 14 may become inoperable.

In the embodiment depicted in FIG. 1, the IC Chip 14 may be bonded to a printed circuit board 10 (hereinafter "circuit board") by a plurality of solder connections or solder bumps 12. The IC chip 14 may be bonded to the circuit board 10 by means of any suitable bonding method. Exemplary chip bonding processes are well known to those skilled in the art. In one embodiment, for example, a Controlled Collapse Chip Connection (C4) process may be used to couple the IC chip 14 to the circuit board 10 using the solder connections 12. The circuit board 10 may include a plurality of interconnected electronic components (not shown) transferring information and signals from one another as well as to external devices (not shown). Such interconnected electronic components may include one or more additional IC chips similar to the IC chip 14.

Figure 2:
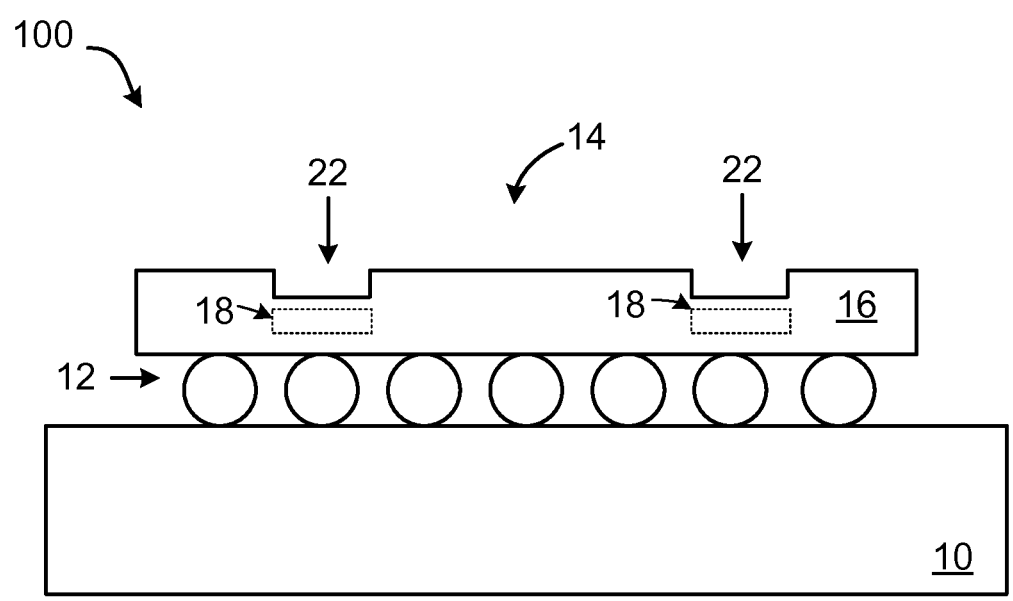
FIG. 2 is a cross-sectional view of a semiconductor structure depicting the formation of recesses in a silicon substrate of the IC chip, according to an embodiment of the present disclosure.

Referring now to FIG. 2, recesses 22 may be formed near the critical circuits 18 within the silicon substrate 16 of the IC chip 14. The recesses 22 may be formed in the silicon substrate 16 by any etching technique known in the art. In one embodiment, the recesses 22 may be formed by using a laser ablation technique or a reactive ion etching (RIE) technique. The depth of the recesses 22 may be determined by a thickness of the silicon substrate 16, the location of the critical circuits 18 within the same and by the desired length of the shelf life of the IC chip 14. The larger the distance between the recesses 22 and the critical circuits 18, the longer the shelf life of the IC chip 14 may be. In one embodiment, the recesses 22 may have a depth ranging from approximately 0 μm to approximately 200 μm. In another embodiment, the recesses 22 may have a depth ranging from approximately 10 μm to approximately 1 mm.

Figure 3:
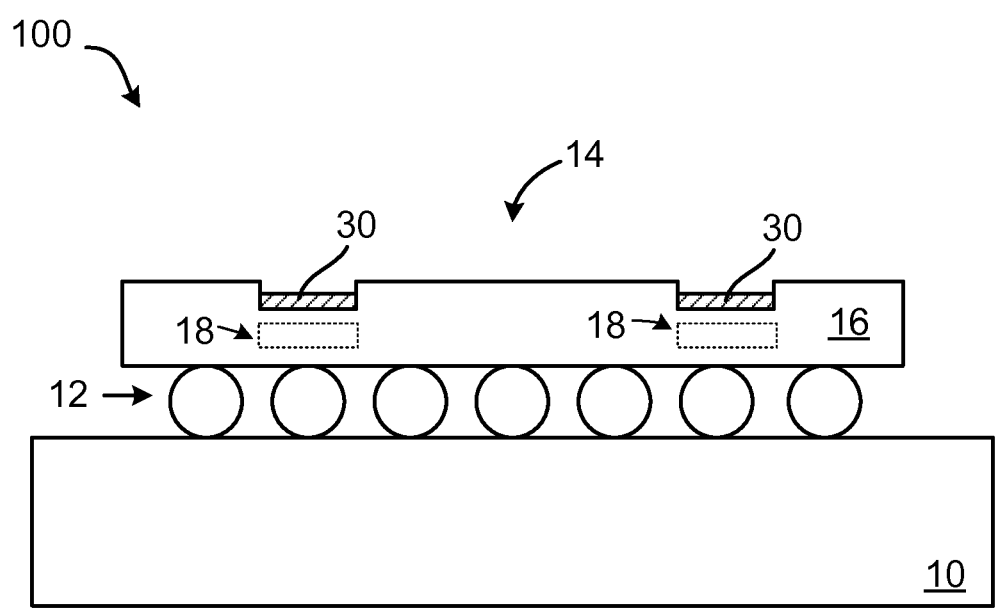
FIG. 3 is a cross-sectional view of a semiconductor structure depicting the deposition of a metal layer within the recesses, according to an embodiment of the present disclosure.

Referring now to FIG. 3, a metal layer 30 may be deposited in the recesses 22 (FIG. 2). The metal layer 30 may include a thin layer of copper or copper-rich material. In one embodiment, the metal layer 30 may be deposited in an island-like fashion within the recesses 22 (FIG. 2) meaning that the metal layer 30 may not completely cover a bottom portion of the recesses 22 (FIG. 2) and may be substantially positioned in a central area within the recesses 22 (FIG. 2). The metal layer 30 may be formed by any suitable deposition method known in the art. In one embodiment, the metal layer 30 may be deposited by electron-beam evaporation of copper or copper-rich material. The thickness of the metal layer 30 may vary from approximately 100 nm to approximately 1000 nm. It should be noted that alignment may not be critical during formation of the metal layer 30.

Figure 4:
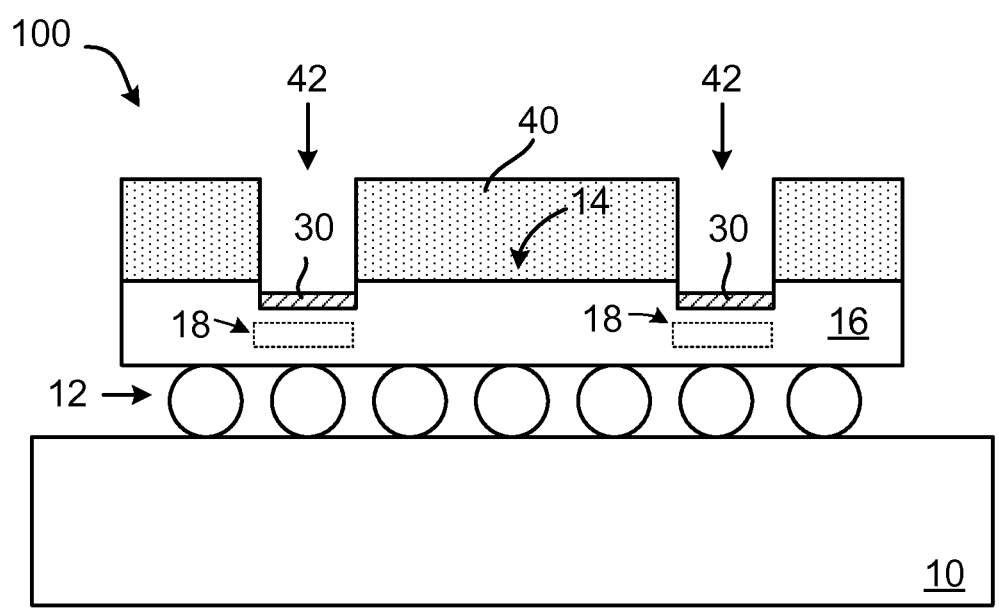
FIG. 4 is a cross-sectional view of a semiconductor structure depicting the formation of a heat sink above the silicon substrate, according to an embodiment of the present disclosure.

Referring now to FIG. 4, in some embodiments, additional structures may be formed above the silicon substrate 16. Such structures may include a heat sink 40. The heat sink 40 may be formed to dissipate the heat generated during operation of the IC chip 14 and to maintain device performance. Formation of heat sinks in IC technologies is typical and well-known to those skilled in the art and may include attaching a layer of a metal material that may have suitable thermal properties in order to draw excess heat from the IC chip. Examples of such metal materials include, but are not limited to, nickel, copper, palladium, and alloys thereof. In one embodiment the heat sink 40 may include aluminum.

In embodiments where structures are formed above the silicon substrate, additional process steps may be undertaken to expose the metal layer 30. For example, holes 42 may be formed in the heat sink 40 in order to expose the metal layer 30. It should be noted that in order for the silicon-copper reaction to occur, the metal layer 30 may not be covered by a non-oxygen containing structure such as the heat sink 40.

Figure 5:
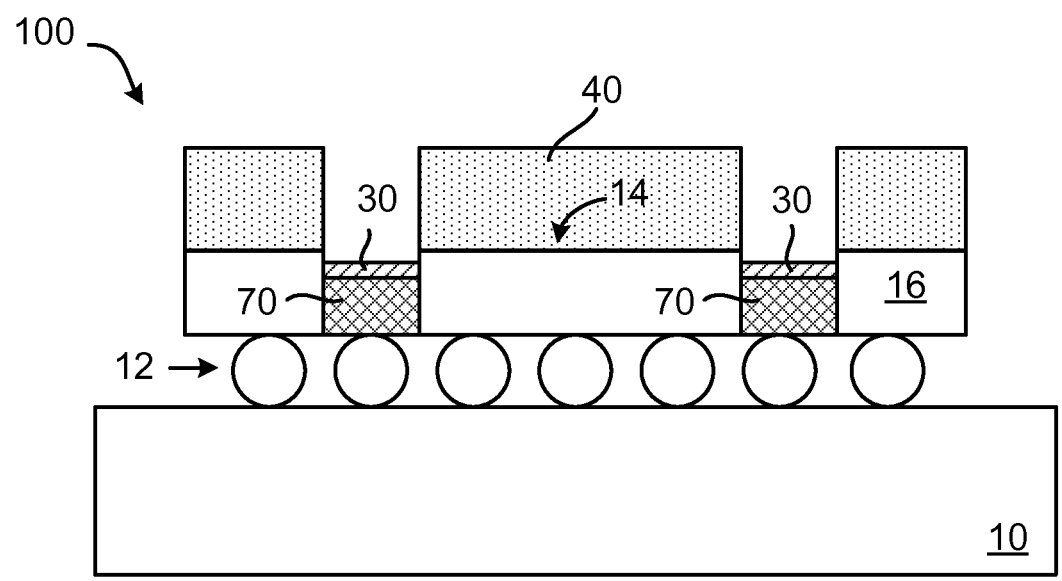
FIG. 5 is a cross-sectional view of a semiconductor structure depicting the IC chip being exposed to an oxygen-containing environment, according to an embodiment of the present disclosure.

Referring to FIG. 5, the semiconductor structure 100 may be placed in an oxygen-containing environment so that a silicon dioxide ($SiO_2$) layer 70 may be formed beneath the metal layer 30 after the catalytic oxidation of the silicon substrate 16. Exposing the semiconductor structure 100 to the oxygen-containing environment at ambient conditions may initiate the oxidation of the silicon substrate 16. During the oxidation process the copper in the metal layer 30 may act as a catalyst. The catalytic oxidation of the silicon substrate 16 may start the spontaneous growth of the silicon dioxide layer 70 beneath the metal layer 30. The silicon dioxide layer 70 may grow until consuming a portion of the silicon substrate 16 beneath the metal layer 30 reaching the adjacent critical circuits 18 (FIG. 4) and thereby damaging the critical circuits 18 (FIG. 4) which may cause the IC chip 14 to be inoperable.

The oxidation of the silicon substrate 16 may result from the segregation of copper atoms from the metal layer 30 at an interface between the silicon substrate 16 and the growing silicon dioxide layer 70 and of oxygen diffusion through the growing silicon dioxide layer 70. Typically, the rate at which the silicon dioxide layer 70 grows may depend on the amount of copper atoms present at the moving interface between the silicon substrate 16 and the silicon dioxide layer 70. In one embodiment, growth rate of the silicon dioxide layer 70 at ambient conditions and without any additional power supply may range from approximately 150 nm/month to approximately 1 μm/month. The catalytic effect of interfacial copper atoms from the metal layer 30 may facilitate the oxidation of the silicon substrate 16 by changing the atomic bonding arrangement at the interface. It should be noted that a constant supply of oxygen may be required to carry out this reaction at ambient conditions.

The silicon dioxide layer 70 may consume a portion of the silicon substrate 16 located below the metal layer 30 damaging the adjacent critical circuits 18 (FIG. 4). The time required to oxidize the portion of the silicon substrate 16 located below the metal layer 30 may be proportional to a distance between the metal layer 30 and the critical circuits 18 which may be substantially similar to a thickness of the silicon substrate 16 minus a depth of the recesses 22. Therefore, the distance between the metal layer 30 and the critical circuits 18 may define a time for the silicon dioxide layer 70 to reach the critical circuits 18 (FIG. 4) and make the IC chip 14 inoperable hence imposing a shelf life to the IC chip 14. For example, in one embodiment, the portion of the silicon substrate 16 below the metal layer 30 may include a thin silicon layer that may be rapidly oxidized damaging the critical circuits 18 and in turn setting a shorter shelf life for the IC chip 14. In another embodiment, the portion of the silicon substrate 16 below the metal layer 30 may include a thick silicon layer that may take longer time to oxidized and reach the critical circuits 18, this in turn may set a longer shelf life for the IC chip 14. Once the IC chip 14 is no longer functioning, it may be impossible to repair.

Figure 6:
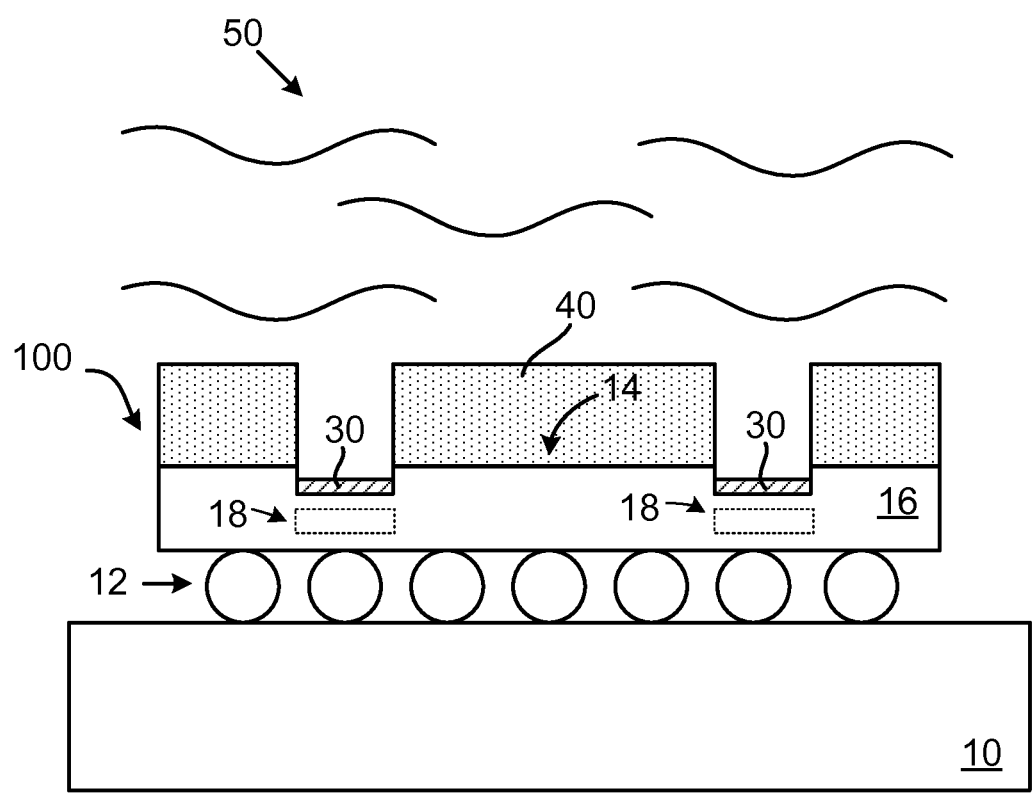
FIG. 6 is a cross-sectional view of a semiconductor structure depicting the IC chip being exposed to an oxygen-containing fluid, according to an embodiment of the present disclosure.

Referring to FIG. 6, the oxygen-containing environment of FIG. 5 may be an oxygen-containing fluid in an ambient atmosphere. In one embodiment, the oxygen-containing fluid 50 may include air. In the presence of oxygen, and under ambient conditions of pressure and temperate, the oxidation process of the silicon substrate 16 may spontaneously begin. As previously explained, during the oxidation process the copper diffusing from the metal layer 30 may act as a catalyst. It should be noted that a continuous supply of the oxygen-containing fluid may be necessary for the oxidation process to progress.

Figure 7:
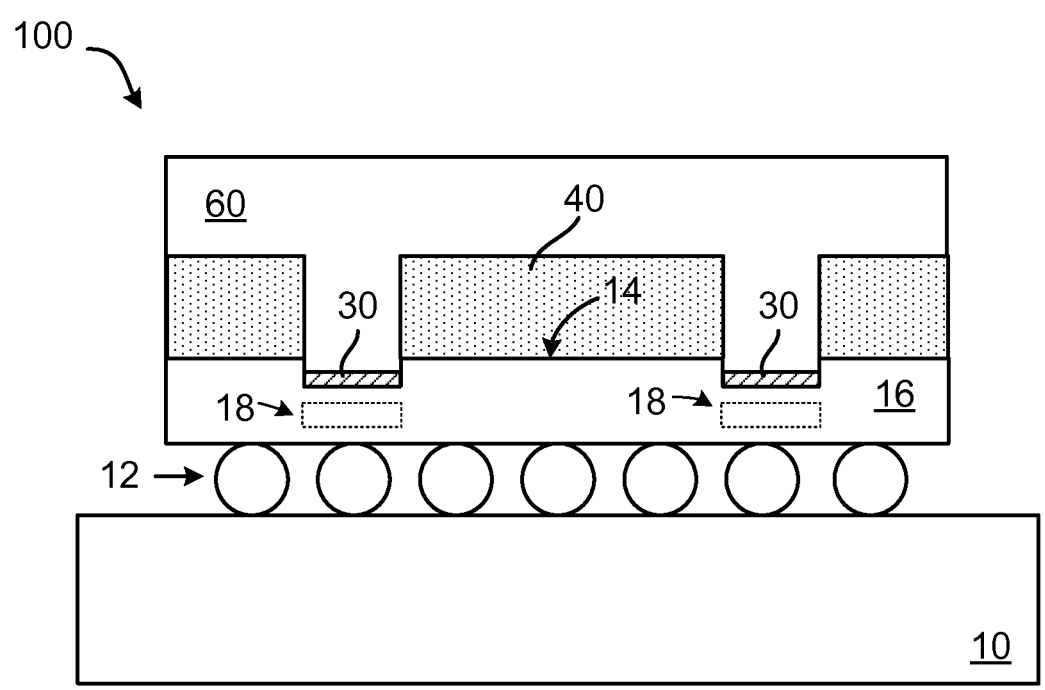
FIG. 7 is a cross-sectional view of a semiconductor structure depicting the IC chip being enclosed in a chamber containing pressurized oxygen, according to an embodiment of the present disclosure.

Referring to FIG. 7, the oxygen-containing environment of FIG. 5 may be a closed chamber 60 containing pressurized oxygen. In this embodiment, the closed chamber 60 may guarantee a steady supply of oxygen to the IC chip 14 during the catalytic oxidation of the silicon substrate 16.

Therefore, using the catalytic oxidation reaction between copper, oxygen and silicon at ambient conditions of pressure and temperature to form IC chips having a shelf life may have multiple advantages over known techniques in the art, including, but not limited to: controlling a time for the oxidation of the silicon substrate may facilitate imposing an expiration date to the IC chip, since the oxidation of the silicon substrate may occur at ambient conditions power supply may not be required which may potentially reduce manufacturing costs, the ability to limit the life of IC chips may help preventing misuse of sensitive data contained in such devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a semiconductor structure, the method comprising:
    forming a recess within a silicon substrate of an integrated circuit (IC) chip, wherein the recess is located near a circuit of the IC chip;
    forming a metal layer in a bottom portion of the recess; and
    exposing the IC chip to an oxygen-containing environment to initiate an oxidation of a portion of the silicon substrate located below the metal layer in the bottom portion of the recess and above the circuit,
    wherein a thickness of the portion of the silicon substrate located below the metal layer in the bottom portion of the recess and above the circuit determines a time for the portion of the silicon substrate to be oxidized and reach the circuit, and
    wherein the time for the portion of the silicon substrate to be oxidized corresponds to a shelf life for the IC chip.

2. The method of claim 1, wherein the circuit is critical for the proper functioning of the IC chip.

3. The method of claim 1, wherein the oxidation of the portion of the silicon substrate located above the circuit progresses until reaching the circuit.

4. The method of claim 1, wherein exposing the IC chip to the oxygen-containing environment comprises providing a constant supply of oxygen.

5. The method of claim 4, wherein the oxygen-containing environment comprises an oxygen-containing fluid such as air.

6. The method of claim 4, wherein the oxygen-containing environment comprises a closed chamber containing pressurized oxygen.

7. The method of claim 1, further comprising:
    forming a heat sink above the semiconductor substrate prior to exposing the IC chip to the oxygen-containing environment; and
    forming recesses in the heat sink to exposed the metal layer.

8. The method of claim 1, wherein forming the metal layer comprises depositing a layer of a copper-rich material within the recess.

9. The method of claim 8, wherein the metal layer is deposited in an island-like fashion.

10. The method of claim 8, wherein copper atoms from the metal layer diffuse to an interface between the portion of the silicon substrate and a layer of silicon dioxide to catalyze the oxidation of the portion of the silicon substrate.

11. The method of claim 1, wherein exposing the IC chip to the oxygen-containing environment comprises spontaneously growing a layer of silicon dioxide that consumes the portion of the silicon substrate beneath the metal layer.

12. The method of claim 1, wherein the oxidation of the silicon substrate occurs at ambient conditions of pressure and temperature.

* * * * *